United States Patent
Hattori et al.

(10) Patent No.: US 9,991,151 B2
(45) Date of Patent: Jun. 5, 2018

(54) CHIP SPACING MAINTAINING APPARATUS

(71) Applicant: DISCO CORPORATION, Tokyo (JP)

(72) Inventors: Atsushi Hattori, Tokyo (JP); Atsushi Ueki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 375 days.

(21) Appl. No.: 14/789,572

(22) Filed: Jul. 1, 2015

(65) Prior Publication Data

US 2016/0007479 A1   Jan. 7, 2016

(30) Foreign Application Priority Data

Jul. 1, 2014 (JP) .................................. 2014-135532

(51) Int. Cl.
  *H01L 21/67* (2006.01)
  *H01L 21/683* (2006.01)
  *H01L 21/78* (2006.01)

(52) U.S. Cl.
  CPC .... *H01L 21/6836* (2013.01); *H01L 21/67115* (2013.01); *H01L 21/67132* (2013.01); *H01L 21/78* (2013.01); *H01L 2221/68336* (2013.01)

(58) Field of Classification Search
  CPC ............... H01L 21/78; H01L 21/6836; H01L 2221/68336; H01L 21/67115; H01L 21/67132
  See application file for complete search history.

(56) References Cited

U.S. PATENT DOCUMENTS

| | | | | |
|---|---|---|---|---|
| 2004/0180473 A1* | 9/2004 | Kawai | ................ | B23K 26/0057 438/114 |
| 2005/0259459 A1* | 11/2005 | Nagai | ................ | B23K 26/0057 365/63 |
| 2015/0364375 A1* | 12/2015 | Nakamura | ............ | H01L 21/268 438/462 |

FOREIGN PATENT DOCUMENTS

| | | |
|---|---|---|
| JP | 2011-077482 | 4/2011 |
| JP | 2012-156400 | 8/2012 |

* cited by examiner

*Primary Examiner* — Livius R Cazan
(74) *Attorney, Agent, or Firm* — Greer Burns & Crain Ltd.

(57) ABSTRACT

A chip spacing maintaining apparatus for maintaining the spacing between any adjacent ones of a plurality of chips obtained by dividing a workpiece attached to an expand sheet, the expand sheet being supported at its peripheral portion to an annular frame is provided. The chip spacing maintaining apparatus includes a far-infrared radiation applying unit for applying far-infrared radiation toward the expand sheet expanded in a target area between the outer circumference of the workpiece and the inner circumference of the annular frame, thereby shrinking the expand sheet in the target area, and an air layer forming unit provided adjacent to the far-infrared radiation applying unit, the air layer forming unit having a nozzle hole for discharging a gas toward the workpiece in applying the far-infrared radiation from the far-infrared radiation applying unit toward the expand sheet, thereby forming an air layer above the workpiece.

1 Claim, 7 Drawing Sheets

CHIP SPACING MAINTAINING APPARATUS

BACKGROUND OF THE INVENTION

Field of the Invention

The present invention relates to a chip spacing maintaining apparatus for maintaining the spacing between chips formed by expanding an expand sheet.

Description of the Related Art

In compact and lightweight electronic equipment represented by a mobile phone, a device chip having a device such as an IC is an essential component. Such a device chip (which will be hereinafter referred to simply as chip) is manufactured by using wafer formed of silicon, for example, partitioning the front side of the wafer with a plurality of division lines called streets to thereby form a plurality of separate regions, forming a device in each separate region, and dividing the wafer along each street.

In recent years, there has been put into practical use a dividing method including the steps of forming a modified layer as a division start point inside the wafer along each street and next applying an external force to the wafer, thereby dividing the wafer along each street to obtain a plurality of chips (see Japanese Patent Laid-Open No. 2011-77482, for example). In this dividing method, an expand sheet is attached to the wafer in which the modified layer is formed, and the expand sheet is expanded to thereby apply an external force to the wafer.

To maintain the spacing between the chips formed by expanding the expand sheet, there has been proposed a method including the step of heating the expand sheet in the area between the outer circumference of the wafer and the inner circumference of an annular frame fixed to the peripheral portion of the expand sheet, thereby partially shrinking the expand sheet expanded in this area (see Japanese Patent Laid-Open No. 2012-156400, for example). Accordingly, the increased spacing between the chips can be maintained by this method to thereby facilitate a subsequent handling operation or the like.

SUMMARY OF THE INVENTION

However, the above method of maintaining the spacing between the chips has a problem such that the volatile components of the expand sheet volatilized by the heating may be deposited to the chips, causing the contamination of the chips.

It is therefore an object of the present invention to provide a chip spacing maintaining apparatus which can suppress the contamination of the chips in maintaining the spacing between the chips.

In accordance with an aspect of the present invention, there is provided a chip spacing maintaining apparatus for maintaining the spacing between any adjacent ones of a plurality of chips obtained by dividing a workpiece attached to an expand sheet, the expand sheet being supported at its peripheral portion to an annular frame, the chip spacing maintaining apparatus including a table having a support surface for supporting the workpiece, the support surface being adapted to hold the workpiece through the expand sheet under suction; fixing means for fixing the annular frame to the peripheral portion of the table; expanding means for expanding the expand sheet to form the spacing between the chips; far-infrared radiation applying means provided above the support surface of the table for applying far-infrared radiation toward the expand sheet expanded by the expanding means in a target area between an outer circumference of the workpiece and an inner circumference of the annular frame, thereby shrinking the expand sheet in the target area; positioning means for moving the far-infrared radiation applying means between a standby position and an operational position where the far-infrared radiation is applied to the expand sheet; and air layer forming means provided adjacent to the far-infrared radiation applying means, the air layer forming means having a nozzle hole for discharging a gas toward the workpiece in applying the far-infrared radiation from the far-infrared radiation applying means toward the expand sheet, thereby forming an air layer above the workpiece.

The chip spacing maintaining apparatus according to the present invention includes the air layer forming means for forming an air layer above the workpiece as described above. Accordingly, the deposition of the volatile components of the expand sheet volatilized by the heat of the far-infrared radiation can be suppressed by the air layer. As a result, the contamination of the chips with the volatile components of the expand sheet can be suppressed in maintaining the increased spacing between the chips.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
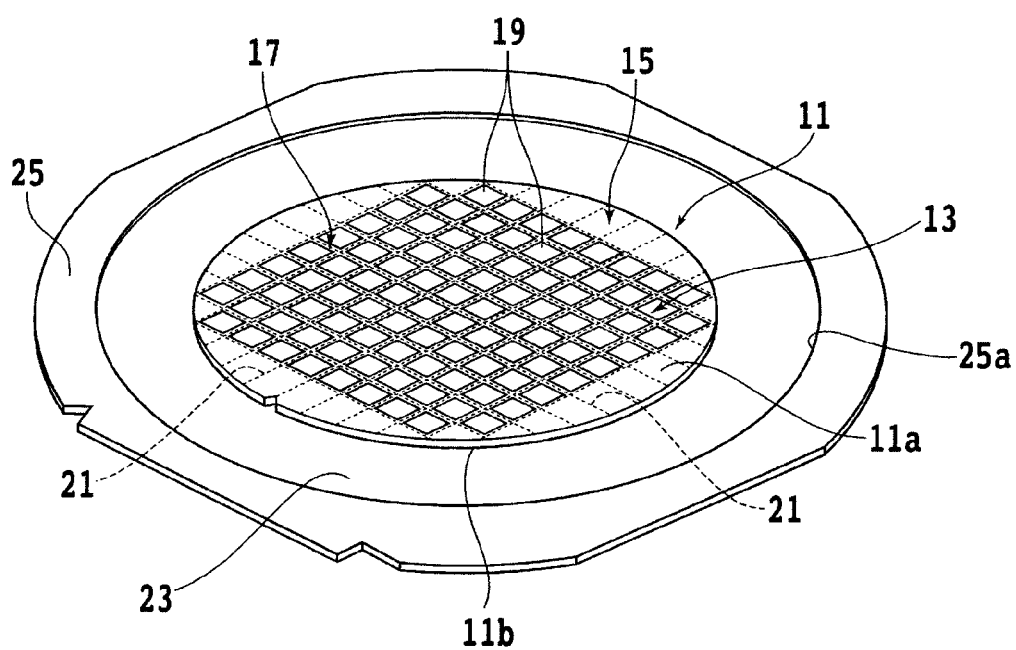
FIG. 1 is a perspective view schematically showing a workpiece to be processed by a chip spacing maintaining apparatus according to a preferred embodiment of the present invention.

A preferred embodiment of the present invention will now be described with reference to the attached drawings. FIG. 1 is a perspective view schematically showing a workpiece to be processed by a chip spacing maintaining apparatus according to this preferred embodiment. As shown in FIG. 1, a workpiece 11 is a substantially circular platelike workpiece (wafer) formed of silicon, for example. The workpiece 11 has a front side 11a and a back side 11b. The front side 11a of the workpiece 11 is composed of a central device area 13 and a peripheral marginal area 15 surrounding the device area 13. The device area 13 is partitioned into a plurality of regions by a plurality of crossing streets (division lines) 17. A plurality of devices 19 such as ICs are formed in these plural regions, respectively. The outer circumference of the workpiece 11 is chamfered to have a round shape in cross section.

A modified layer 21 as a division start point is formed inside the workpiece 11 along each street 17. For example, the modified layer 21 is formed by focusing a laser beam inside the workpiece 11, wherein the laser beam has a wavelength hardly absorptive to the workpiece 11. The modified layer 21 may be replaced by a laser-processed groove or a cut groove formed along each street 17 as the division start point. An expand sheet 23 having a diameter larger than that of the workpiece 11 is attached to the back side 11b of the workpiece 11. The expand sheet 23 is formed of resin or the like, and it is expansible by applying an external force. An annular frame 25 having a substantially circular opening 25a is mounted on the peripheral portion of the expand sheet 23. In other words, the workpiece 11 is supported through the expand sheet 23 to the annular frame 25. While the expand sheet 23 is attached to the back side 11b of the workpiece 11 as shown in FIG. 1, the expand sheet 23 may be attached to the front side 11a of the workpiece 11.

Figure 2:
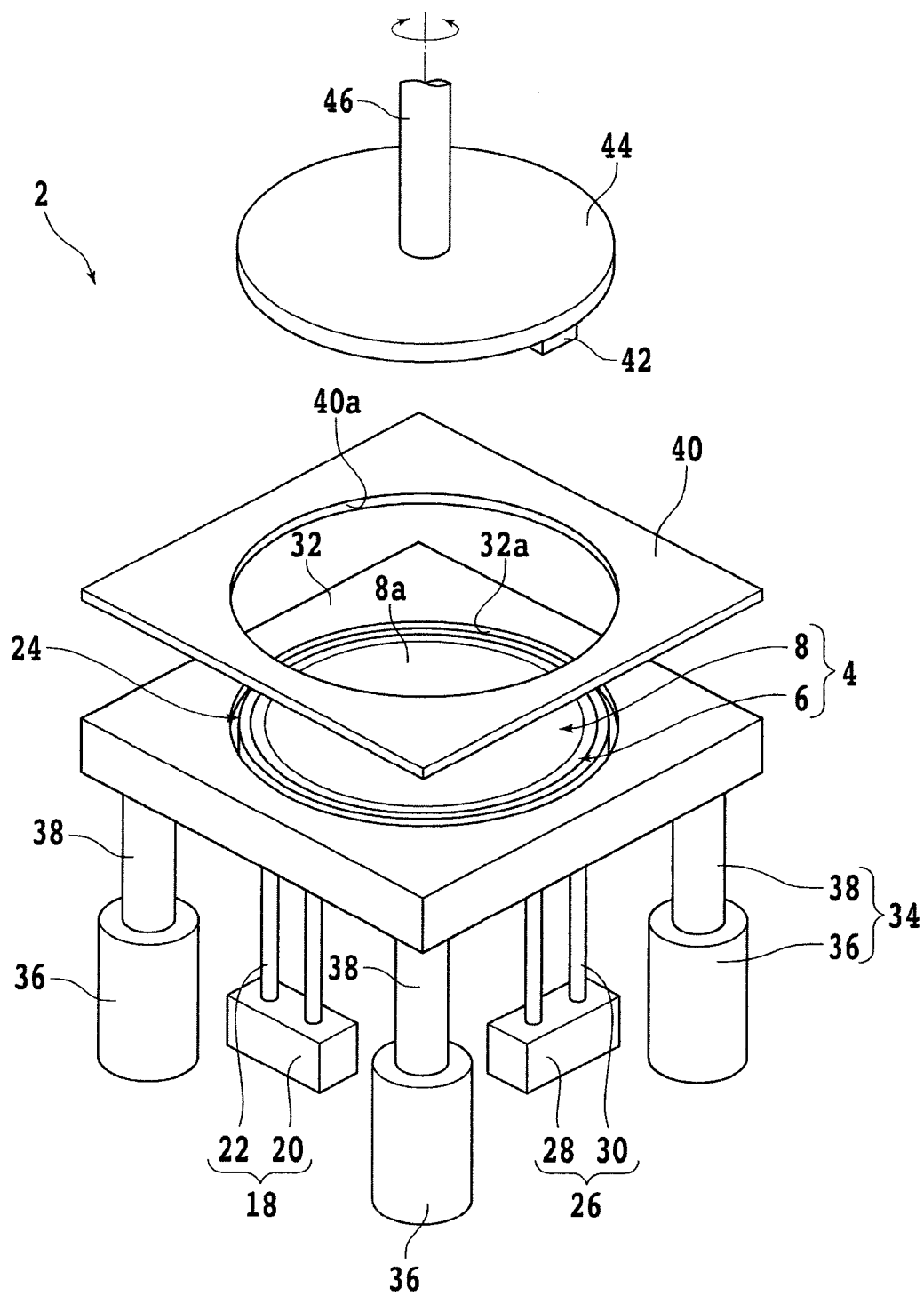
FIG. 2 is a schematic perspective view showing the configuration of the chip spacing maintaining apparatus.
Figure 3:
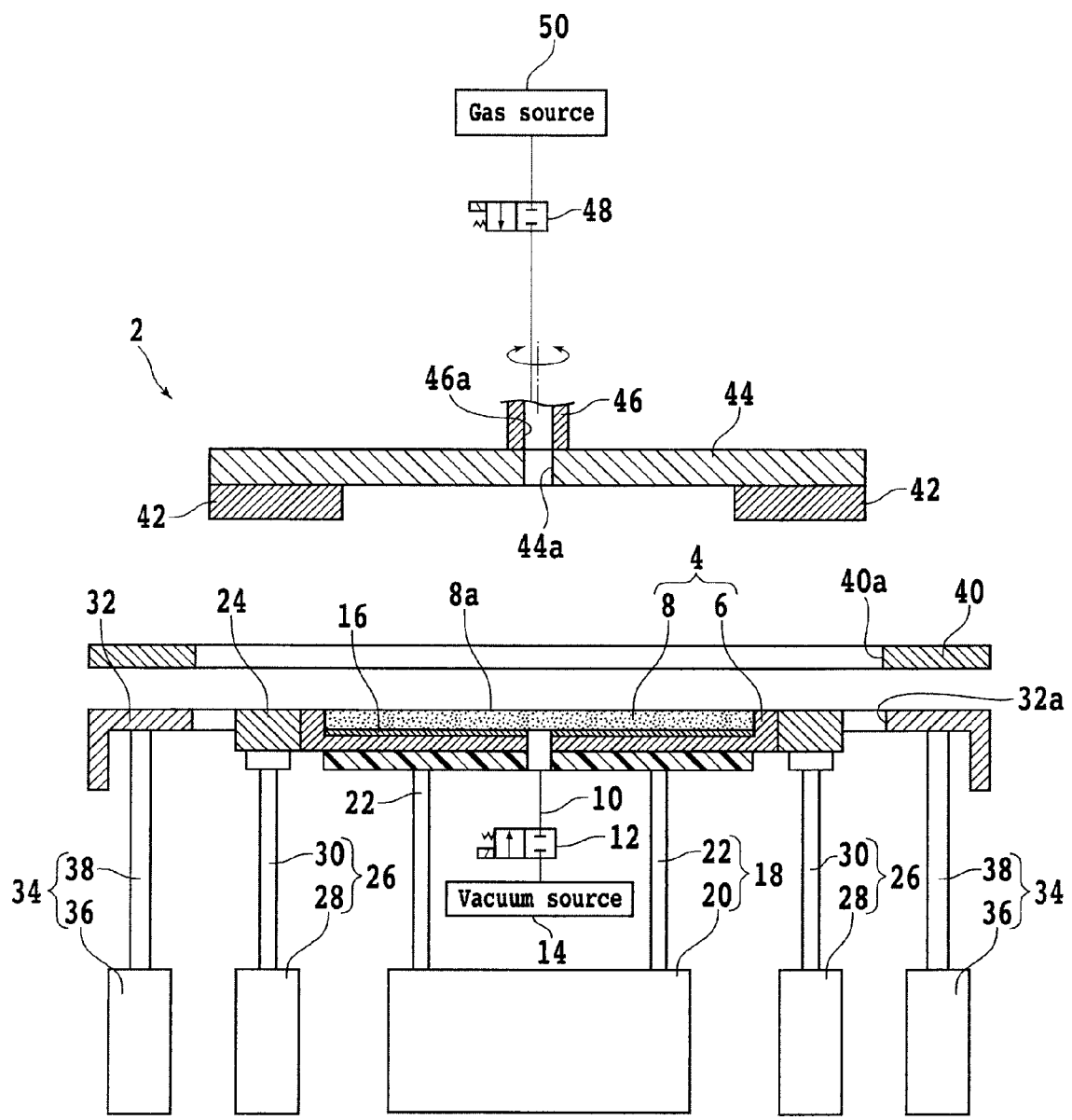
FIG. 3 is a schematic sectional view of the chip spacing maintaining apparatus.

FIG. 2 is a perspective view schematically showing the configuration of the chip spacing maintaining apparatus according to this preferred embodiment, and FIG. 3 is a schematic sectional view of the chip spacing maintaining apparatus shown in FIG. 2. As shown in FIGS. 2 and 3, a chip spacing maintaining apparatus 2 includes a support table (table) 4 for supporting the workpiece 11. The support table 4 includes a disk-shaped frame 6 formed of a metal material such as stainless steel and a porous member 8 provided on the upper surface of the frame 6 at its central portion. The porous member 8 is a disk-shaped member having a diameter substantially equal to the diameter of the workpiece 11. As shown in FIG. 3, the porous member 8 is connected through a suction line 10 and a valve 12 to a vacuum source 14, wherein the suction line 10 and the valve 12 are located below the support table 4. The porous member 8 has an upper surface as a support surface 8a for supporting the workpiece 11. The workpiece 11 supported on the support surface 8a of the porous member 8 can be held under suction by the operation of the vacuum source 14. More specifically, the workpiece 11 is supported on the support surface 8a of the porous member 8 in the condition where the expand sheet 23 attached to the back side 11b of the workpiece 11 is in contact with the support surface 8a. In this condition, the vacuum produced by the vacuum source 14 is applied to the porous member 8 to thereby hold the workpiece 11 through the expand sheet 23 on the support table 4. Further, a sheet heater 16 for heating the support surface 8a is provided below the porous member 8, so that the expand sheet 23 held under suction on the support table 4 can be heated.

Two support table elevating mechanisms (expanding means) 18 (one of which being shown) are provided below the frame 6. Each support table elevating mechanism 18 includes a cylinder case 20 and a pair of piston rods 22 inserted in the cylinder case 20. The support table 4 is fixed to the upper ends of the piston rods 22 of each support table elevating mechanism 18. The height of the support table 4 is adjusted by the two support table elevating mechanisms 18. An annular peripheral table 24 formed of a metal material such as stainless steel is provided so as to surround the outer circumference of the frame 6. Two peripheral table elevating mechanisms (expanding means) 26 are provided below the peripheral table 24. Each peripheral table elevating mechanism 26 includes a cylinder case 28 and a pair of piston rods 30 inserted in the cylinder case 28. The peripheral table 24 is fixed to the upper ends of the piston rods 30 of each peripheral table elevating mechanism 26. The height of the peripheral table 24 is adjusted by the two peripheral table elevating mechanisms 26.

A mounting table 32 for mounting the annular frame 25 is provided around the peripheral table 24. The mounting table 32 has a circular central opening 32a corresponding to the support table 4 and the peripheral table 24. That is, the support table 4 and the peripheral table 24 are positioned in the opening 32a of the mounting table 32. Four mounting table elevating mechanisms 34 are provided below the mounting table 32. Each mounting table elevating mechanism 34 includes a cylinder case 36 and a piston rod 38 inserted in the cylinder case 36. The mounting table 32 is fixed to the upper end of the piston rod 38 of each mounting table elevating mechanism 34. The height of the mounting table 32 is adjusted by the four mounting table elevating mechanisms 34. The mounting table 32 has an upper surface as a mounting surface for mounting the annular frame 25 in the condition where the front side 11a of the workpiece 11 is exposed upward. Accordingly, the workpiece 11 is positioned near the center of the opening 32a of the mounting table 32 and supported through the expand sheet 23 on the support table 4. There is provided above the mounting table 32 a plate (fixing means) 40 for pressing the annular frame 25 mounted on the mounting table 32 from the upper side thereof to thereby fix the annular frame 25 to the mounting table 32. The plate 40 has a circular central opening 40a corresponding to the opening 32a of the mounting table 32. The workpiece 11 and a part of the expand sheet 23 are exposed upward from the opening 40a of the plate 40. After fixing the annular frame 25 by using the plate 40, the support table elevating mechanisms 18 and the peripheral table elevating mechanisms 26 are operated to raise the support table 4 and the peripheral table 24. In this manner, the support table 4 and the peripheral table 24 are raised relative to the mounting table 32, so that the expand sheet 23 supported to the annular frame 25 can be expanded.

A disk-shaped air layer forming unit (air layer forming means) 44 with two far-infrared radiation heaters (far-infrared radiation applying means) 42 for applying far-infrared radiation is provided above the support table 4 and the peripheral table 24. The far-infrared radiation heaters 42 function to apply far-infrared radiation to a part of the expand sheet 23 exposed from the opening 40a of the plate 40. Each far-infrared radiation heater 42 is adapted to apply far-infrared radiation having a peak wavelength of 3 μm to 25 μm, for example. The far-infrared radiation having such a wavelength is not easily absorbed by a metal material, so that heating of the support table 4 and the peripheral table 24 by the far-infrared radiation can be prevented when shrinking the expand sheet 23 by using the far-infrared radiation heaters 42. That is, the expand sheet 23 can be heated to be shrunk at only the area where the far-infrared radiation is applied. The air layer forming unit 44 is connected through a vertically-extending rotating shaft 46 to a rotational drive source (not shown) such as a motor. The rotating shaft 46 is supported to a moving unit (positioning means) (not shown) for vertically moving the far-infrared radiation heaters 42 and the air layer forming unit 44. The moving unit functions to vertically move the far-infrared radiation heaters 42 and the air layer forming unit 44 between an upper standby position and a lower operational position where the far-infrared radiation is applied to the expand sheet 23. When the far-infrared radiation heaters 42 are positioned at the operational position and then operated to apply the far-infrared radiation as rotating the rotating shaft 46, the expand sheet 23 can be heated by the far-infrared radiation in the area between the outer circumference of the workpiece 11 and the inner circumference of the annular frame 25. As a result, this area of the expand sheet 23 is shrunk. A nozzle hole 44a for discharging a gas (e.g., air) toward the workpiece 11 is formed at the center of the air layer forming unit 44. Further, a supply line 46a is formed in the rotating shaft 46. The nozzle hole 44a of the air layer forming unit 44 is connected through the supply line 46a and a valve 48 to a gas source 50. In applying the far-infrared radiation to the expand sheet 23, the valve 48 is opened to discharge the gas from the nozzle hole 44a. As a result, a gas flow (air layer) is formed above the workpiece 11.

Figure 4:
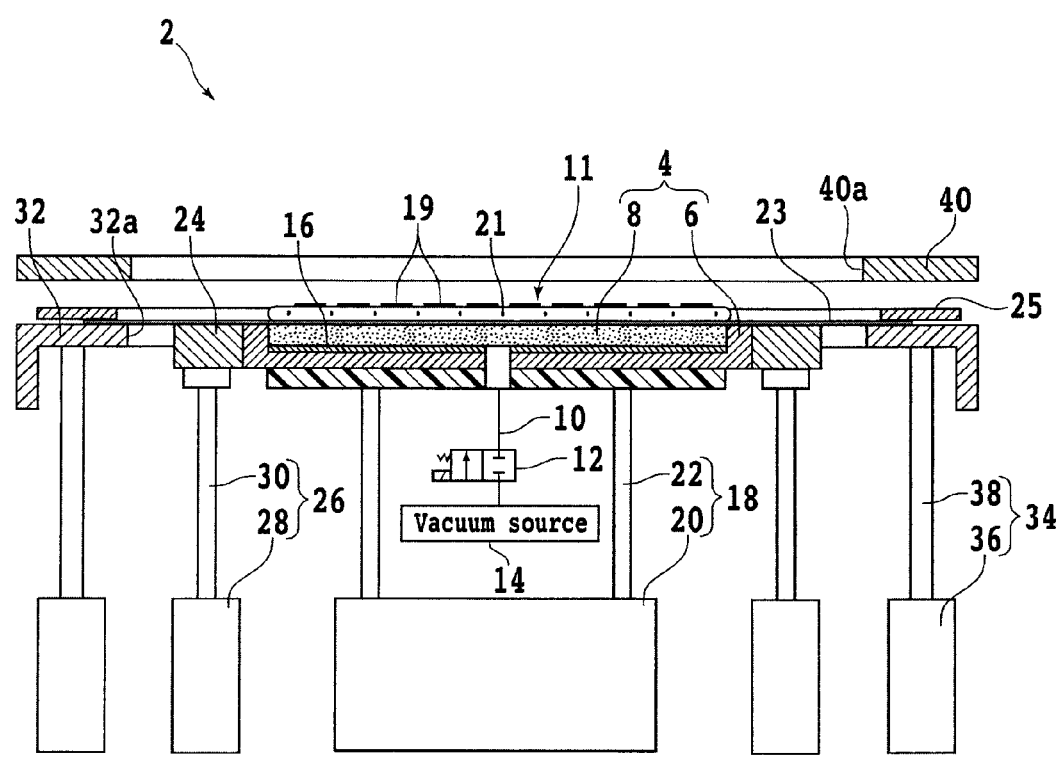
FIG. 4 is a schematic sectional view showing a mounting step.

The operation of the chip spacing maintaining apparatus 2 will now be described. First, a mounting step of mounting the workpiece 11 on the support table 4 is performed. FIG. 4 is a schematic sectional view showing the mounting step. As shown in FIG. 4, the annular frame 25 supporting the workpiece 11 through the expand sheet 23 is mounted on the upper surface of the mounting table 32 in the condition where the front side 11a of the workpiece 11 is exposed upward. Accordingly, the workpiece 11 is supported through the expand sheet 23 on the support table 4. In this mounting step, the valve 12 provided in the suction line 10 is in a closed condition. Further, at the time of performing the mounting step, the sheet heater 16 is preferably operated to preliminarily heat the support surface 8a of the porous member 8 of the support table 4 to a temperature of about 50° C. to 80° C. However, the temperature of the support surface 8a to be heated is not especially limited, but may be changed according to the kind of the expand sheet 23.

Figure 5:
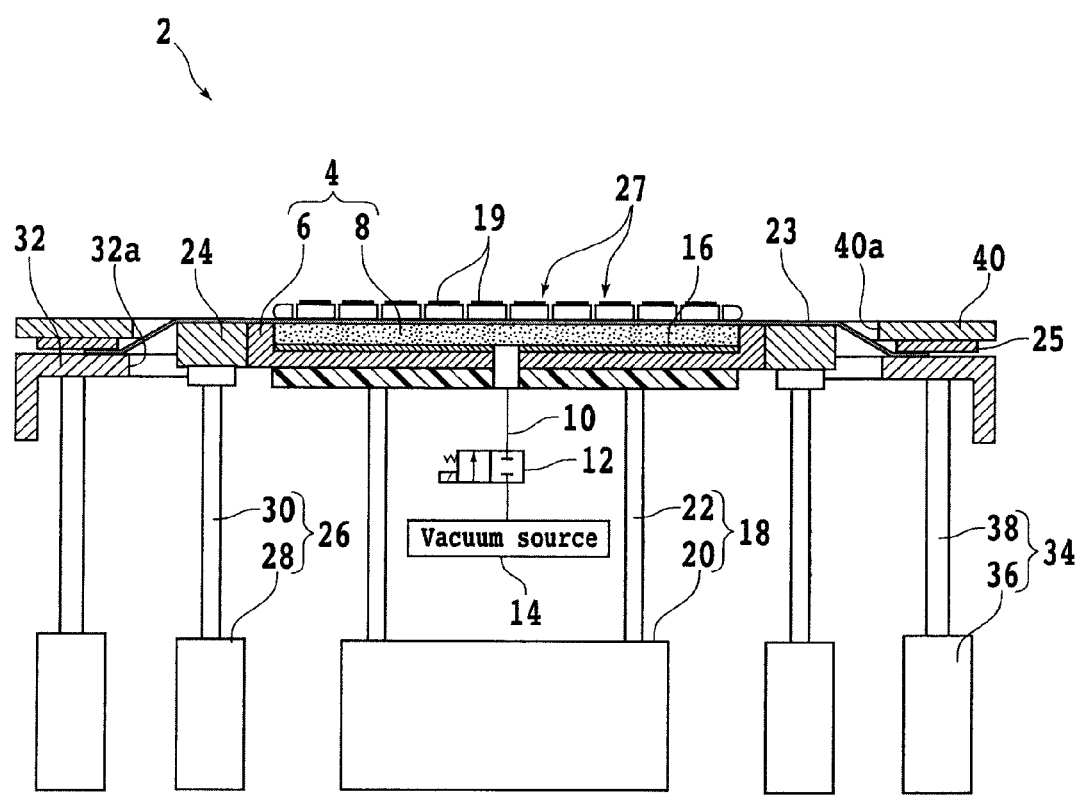
FIG. 5 is a schematic sectional view showing a dividing step.

After performing the mounting step, a dividing step is performed in such a manner that the expand sheet 23 is expanded to divide the workpiece 11. FIG. 5 is a schematic sectional view showing the dividing step. As shown in FIG. 5, the annular frame 25 mounted on the mounting table 32 is fixed by the plate 40, and the support table elevating mechanism 18 and the peripheral table elevating mechanisms 26 are operated to raise the support table 4 and the peripheral table 24. Also in this dividing step, the valve 12 provided in the suction line 10 is in a closed condition, so that the workpiece 11 is not held under suction on the support table 4 at this time. The annular frame 25 is so fixed as to be sandwiched between the mounting table 32 and the plate 40 under pressure. Accordingly, when the support table 4 and the peripheral table 24 are raised relative to the mounting table 32, the expand sheet 23 is expanded. As a result, an external force is applied to the workpiece 11 in the direction of expanding the expand sheet 23, so that the workpiece 11 is divided along each street 17 where the modified layer 21 is formed, thereby obtaining a plurality of chips 27. By the expansion of the expand sheet 23, the spacing between any adjacent ones of the plural chips 27 is increased. As described above, the support surface 8a of the porous member 8 of the support table 4 is preliminarily heated by the sheet heater 16, so that the expand sheet 23 can be sufficiently softened by the heat from the sheet heater 16 and the spacing between the chips 27 can be easily increased. Further, only the central area of the expand sheet 23 corresponding to the workpiece 11 is heated by the sheet heater 16, so that the peripheral area of the expand sheet 23 between the outer circumference of the workpiece 11 and the inner circumference of the annular frame 25 is hardly heated. That is, softening of this peripheral area of the expand sheet 23 by the heat from the sheet heater 16 can be suppressed. In other words, it is possible to prevent excessive expansion of the expand sheet 23 in the peripheral area between the outer circumference of the workpiece 11 and the inner circumference of the annular frame 25.

Figure 6:
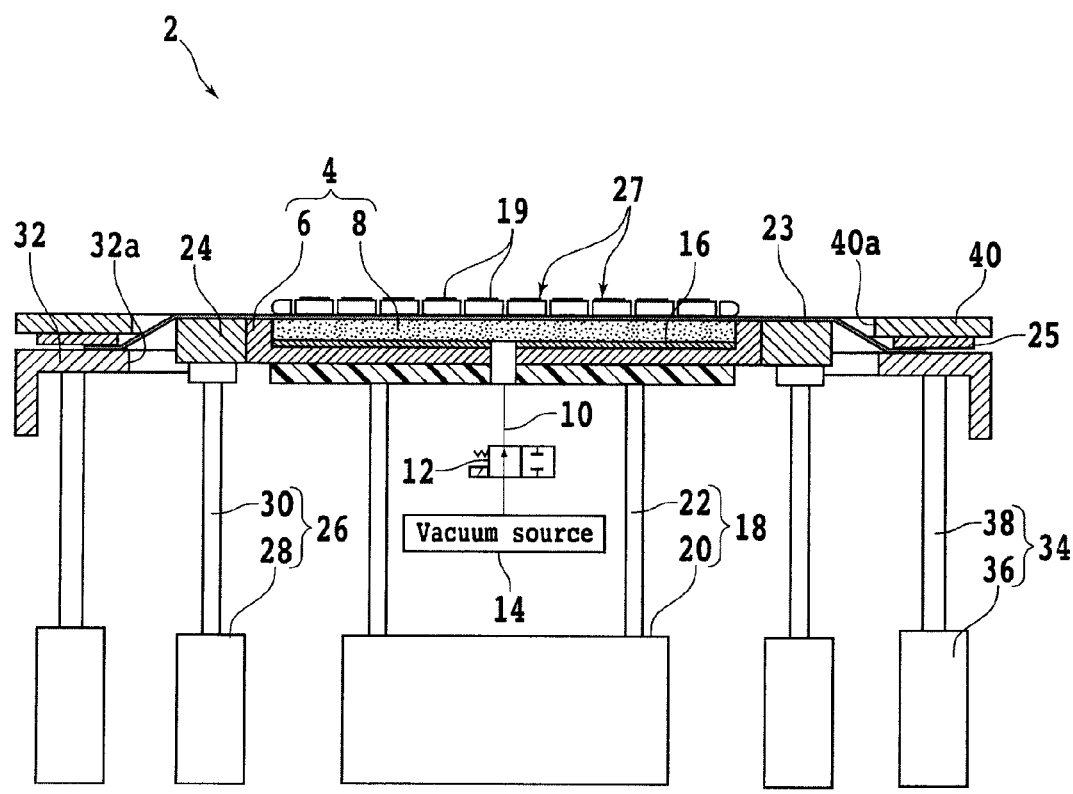
FIG. 6 is a schematic sectional view showing a suction holding step.

After performing the dividing step, a suction holding step is performed in such a manner that the workpiece 11 is held under suction on the support table 4. FIG. 6 is a schematic sectional view showing the suction holding step. As shown in FIG. 6, the valve 12 provided in the suction line 10 is opened to apply the vacuum produced in the vacuum source 14 to the support surface 8a. Accordingly, the plural chips 27 can be held under suction on the support table 4 in the condition where the spacing between the chips 27 has been increased. After holding the plural chips 27 under suction on the support table 4, the support table 4 and the peripheral table 24 are lowered to the same height as that of the mounting table 32.

Figure 7:
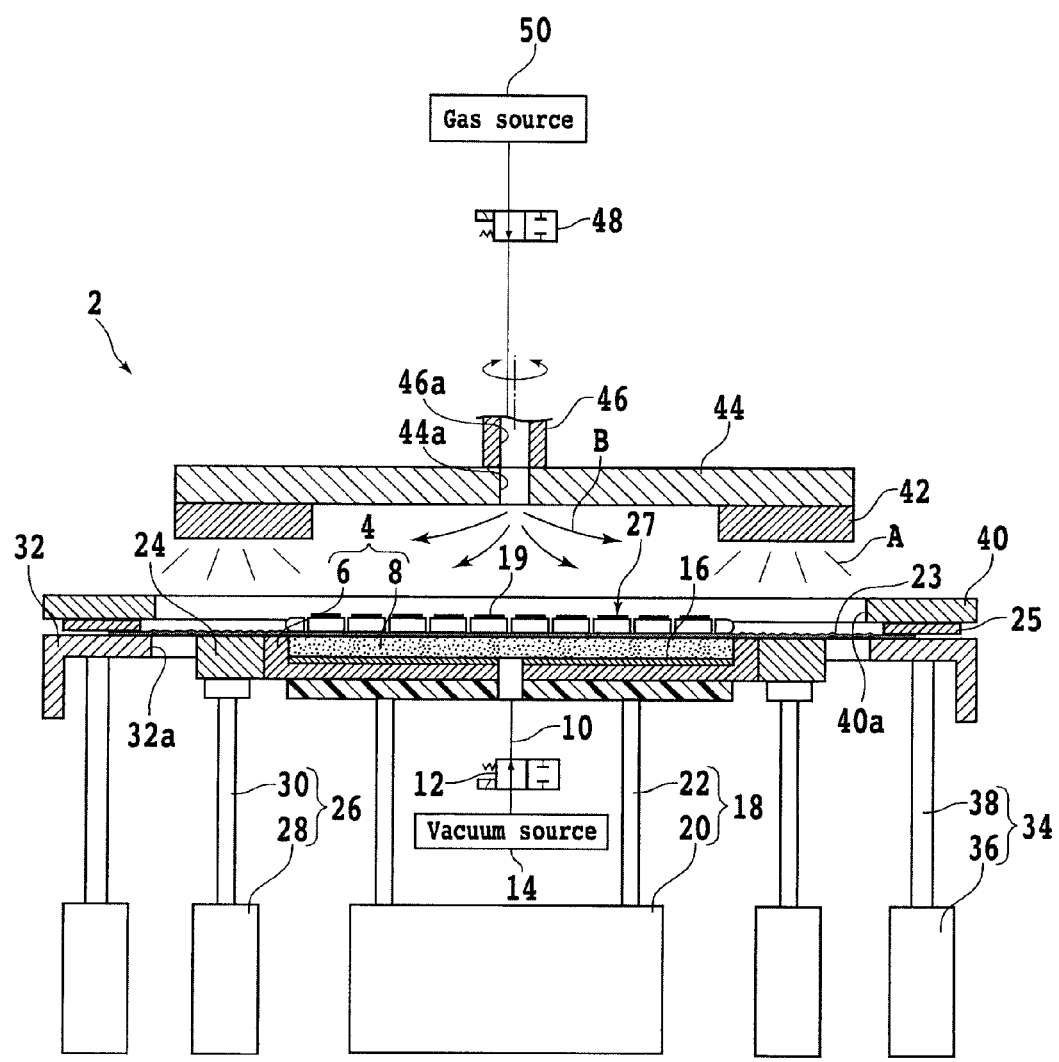
FIG. 7 is a schematic sectional view showing a heating step.

After performing the suction holding step, a heating step is performed in such a manner that the far-infrared radiation is applied to the expand sheet 23. FIG. 7 is a schematic sectional view showing the heating step. As shown in FIG. 7, the far-infrared radiation heaters 42 are lowered from the upper standby position to the lower operational position, and then operated to apply the far-infrared radiation shown by reference symbol A in FIG. 7 as being rotated 180 degrees about the axis of rotation of the rotating shaft 46. For example, the far-infrared radiation A is applied from the far-infrared radiation heaters 42 so as to heat the expand sheet 23 to about 180° C. Furthermore, the valve 48 provided in the supply line 46a is opened to discharge the gas shown by reference symbol B in FIG. 7 from the nozzle hole 44a toward the workpiece 11 (chips 27). Also in this heating step, the valve 12 provided in the suction line 10 is in an open condition. By performing this heating step, the peripheral area of the expand sheet 23 between the outer circumference of the workpiece 11 and the inner circumference of the annular frame 25 can be heated to be shrunk. In heating the expand sheet 23, the flow of the gas B (air layer) toward the radial outside of the workpiece 11 (i.e., toward the annular frame 25) is formed above the workpiece 11, so that the volatile components of the expand sheet 23 volatilized by the heating are hardly deposited to the workpiece 11.

As described above, the chip spacing maintaining apparatus 2 according to this preferred embodiment includes the air layer forming unit (air layer forming means) 44 for forming the flow of the gas B (air layer) above the workpiece 11. Accordingly, the deposition of the volatile components of the expand sheet 23 to the workpiece 11 can be suppressed by the flow of the gas B. As a result, the contamination of the chips 27 can be suppressed in maintaining the condition that the spacing between the chips 27 has been increased. Further, the chip spacing maintaining apparatus 2 according to this preferred embodiment includes the far-infrared radiation heaters (far-infrared radiation applying means) 42 for applying the far-infrared radiation A to the expand sheet 23 in the area between the outer circumference of the workpiece 11 and the inner circumference of the annular frame 25, thereby shrinking this area of the expand sheet 23. That is, the expand sheet 23 can be shrunk by the far-infrared radiation A in only the area between the outer circumference of the workpiece 11 and the inner circumference of the annular frame 25, thereby properly maintaining the spacing between the chips 27. Further, since the far-infrared radiation A is used in the chip spacing maintaining apparatus 2 according to this preferred embodiment, heating of the support table 4 and the peripheral table 24 constituting the chip spacing maintaining apparatus 2 can be prevented. That is, only the expand sheet 23 is heated to be shrunk by the far-infrared radiation A, so that the spacing between the chips 27 can be properly maintained.

The present invention is not limited to the above preferred embodiment, but various modifications may be made. For example, while the support table elevating mechanisms (expanding means) 18 and the peripheral table elevating mechanisms (expanding means) 26 are operated to raise the support table 4 and the peripheral table 24, thereby expanding the expand sheet 23 supported to the annular frame 25 in the above preferred embodiment, the expanding means in the present invention is not limited to the support table elevating mechanisms 18 and the peripheral table elevating mechanisms 26. For example, the mounting table elevating mechanisms 34 may be operated to lower the mounting table 32, thereby expanding the expand sheet 23. In this case, the mounting table elevating mechanisms 34 function as the expanding means. As another modification, the peripheral table elevating mechanisms 26 may be operated to raise only the peripheral table 24, thereby expanding the expand sheet 23. In this case, the peripheral table elevating mechanisms 26 function as the expanding means. Further, the expanding means in the present invention may be any other expanding means of pressing the expand sheet 23 in the area between the outer circumference of the workpiece 11 and the inner circumference of the annular frame 25.

Further, while the far-infrared radiation heaters 42 and the air layer forming unit 44 are moved together by the same moving unit (positioning means) in the above preferred embodiment, the far-infrared radiation heaters 42 and the air layer forming unit 44 may be separately moved by different moving units (positioning means).

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A chip spacing maintaining apparatus for maintaining the spacing between any adjacent ones of a plurality of chips obtained by dividing a workpiece attached to an expand sheet, said expand sheet being supported at its peripheral portion to an annular frame, said chip spacing maintaining apparatus comprising:
   a table having a support surface for supporting said workpiece, said support surface being adapted to hold said workpiece through said expand sheet under suction;
   fixing means for fixing said annular frame to the peripheral portion of said table;
   expanding means for expanding said expand sheet to form the spacing between said chips;
   far-infrared radiation applying means provided above said support surface of said table for applying far-infrared radiation toward said expand sheet expanded by said expanding means in a target area between an outer circumference of said workpiece and an inner circumference of said annular frame, thereby shrinking said expand sheet in said target area;
   positioning means for moving said far-infrared radiation applying means between a standby position and an operational position where the far-infrared radiation is applied to said expand sheet; and
   air layer forming means provided adjacent to said far-infrared radiation applying means, said air layer forming means having a nozzle hole for discharging a gas toward said workpiece in applying the far-infrared radiation from said far-infrared radiation applying means toward said expand sheet, thereby forming an air layer above said workpiece.

* * * * *